(12) United States Patent
Huang et al.

(10) Patent No.: US 8,782,572 B1
(45) Date of Patent: Jul. 15, 2014

(54) METHOD OF OPTICAL PROXIMITY CORRECTION

(71) Applicant: United Microelectronics Corp., Hsin-Chu (TW)

(72) Inventors: Sheng-Yuan Huang, Yunlin County (TW); Chia-Wei Huang, Kaohsiung (TW); Ming-Jui Chen, Hsinchu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/802,587

(22) Filed: Mar. 13, 2013

(51) Int. Cl.
*G06F 17/50* (2006.01)

(52) U.S. Cl.
CPC .................................. *G06F 17/50* (2013.01)
USPC ................................. 716/53; 716/54; 716/55

(58) Field of Classification Search
CPC ....... G03F 1/144; G03F 1/36; G03F 7/70441; G03F 17/5068; G03F 7/707
USPC ............................................... 716/53, 54, 55
See application file for complete search history.

(56) References Cited

U.S. PATENT DOCUMENTS

| | | | |
|---|---|---|---|
| 7,057,715 B2 | 6/2006 | Robinson | |
| 7,065,738 B1 | 6/2006 | Kim | |
| 7,383,530 B2 * | 6/2008 | Wang et al. | 716/52 |
| 2004/0190008 A1 | 9/2004 | Mieher | |
| 2007/0031745 A1 | 2/2007 | Ye | |
| 2007/0094635 A1 * | 4/2007 | Suh et al. | 716/21 |
| 2010/0064274 A1 * | 3/2010 | Grimm | 716/21 |
| 2011/0318673 A1 | 12/2011 | Hung | |

* cited by examiner

*Primary Examiner* — Stacy Whitmore
*Assistant Examiner* — Magid Dimyan
(74) *Attorney, Agent, or Firm* — Winston Hsu; Scott Margo

(57) ABSTRACT

A method of optical proximity correction (OPC) includes the following steps. First, a layout pattern is provided to a computer system. Subsequently, the layout pattern is classified into a first sub-layout pattern and a second sub-layout pattern. Then, an OPC calculation based on a first OPC model is performed on the first sub-layout pattern so as to form a corrected first sub-layout pattern and an OPC calculation based on a second OPC model is performed on the second sub-layout pattern so as to form a corrected second sub-layout pattern. Afterward, the corrected first sub-layout pattern and the corrected second sub-layout pattern are output from the computer system into a photomask.

8 Claims, 4 Drawing Sheets

METHOD OF OPTICAL PROXIMITY CORRECTION

BACKGROUND OF THE INVENTION

1. Field of the Invention

The present invention generally relates to a method of optical proximity correction (OPC), and more particularly, to a method of OPC which comprises more than one OPC model.

2. Description of the Prior Art

With the trend of miniaturization of the electronic products and peripherals, research about thin structures and high integration of the semiconductor devices have become the essential subjects and developing aspects in the industry, and the lithography technology plays an important role to determine the performances of the semiconductor devices.

In semiconductor manufacturing processes, the integrated circuit layout is first designed and formed as a mask pattern. The mask pattern is then proportionally transferred to a photoresist layer disposed on the semiconductor wafer through an exposure process followed by a development process. Subsequently, a corresponding etching process is performed in order to manufacture the semiconductor devices on the semiconductor wafer. With the demand of increasing integration and the decreasing size of the semiconductor devices, the critical dimension (CD) of each segment fabricated through exposure is limited to the resolution limit of the optical exposure tool used for transferring the mask pattern. The optical proximity effect is a problem that easily arises during the exposures of a mask pattern with high-density arranged segments to form a pattern on a photoresist. Such a resolution loss occurs because of overexposure or underexposure, which brings a deviation of the pattern on the photoresist layer from the original mask pattern. Many methods have been used to avoid the deviation caused by the optical proximity effect in order to improve the quality of the transferred pattern. The most popular method is the optical proximity correction (OPC). And there is a variety of commercial optical proximity correction software that can theoretically correct the mask patterns to be more accurately transferred on a wafer.

Currently, a modeled-based optical proximity correction method, which uses optical proximity correction models to simulate the final mask pattern needed to be transferred to the corresponding photoresist layer, is widely used in processes for manufacturing semiconductor devices. Generally, various optical proximity correction models are provided in order to fulfill the needs of various mask patterns. For example, when an original layout pattern corresponding to a $M_O$ structure of a semiconductor device needs to be formed in a semiconductor device, this pattern must be simulated by an optical proximity correction (OPC) method based on a proper optical proximity correction model in order to output a corrected pattern (i.e. a corrected $M_O$ pattern) into a photomask. However, the OPC method, which is based on only one kind of OPC model, can not fulfill the needs of the $M_O$ pattern including different geometric patterns with various length-to-width ratios. Accordingly, some patterns transferred from the photomask to a photoresist layer with a relatively high length-to-width ratio would still collapse even though the optical proximity correction method is applied. Consequently, how to improve the method of optical proximity correction to form the needed mask pattern is still an important issue in the field.

SUMMARY OF THE INVENTION

An objective of the present invention is therefore to provide a method of optical proximity correction (OPC) in order to obtain required corrected mask patterns.

According to one exemplary embodiment of the present invention, a method of optical proximity correction (OPC) includes the following steps. First, a layout pattern is provided to a computer system. Subsequently, the layout pattern is classified into a first sub-layout pattern and a second sub-layout pattern. Then, an OPC calculation based on a first OPC model is performed on the first sub-layout pattern so as to form a corrected first sub-layout pattern and an OPC calculation based on a second OPC model is performed on the second sub-layout pattern so as to form a corrected second sub-layout pattern. Afterward, the corrected first sub-layout pattern and the corrected second sub-layout pattern are outputted from the computer system into a photomask.

The main characteristic of the present invention is the layout pattern that may be first classified into the first sub-layout pattern and the second sub-layout pattern. Preferably, the first sub-layout pattern has a plurality of geometric patterns with length-to-width ratios between 1 and 5 and the second sub-layout pattern has a plurality of geometric patterns with length-to-width ratios higher than 5. Since two OPC calculations with different OPC models (i.e. the first and the second OPC models) are respectively performed on the first sub-layout pattern and the second sub-layout pattern in order to form the corrected first sub-layout pattern and the corrected second sub-layout pattern, the geometric patterns formed in a photoresist layer with relatively high length-to-width ratio may not collapse and may have their contour identical to that of the original layout pattern when transferred through photolithography processes.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The present invention will be understood and appreciated more fully from the following detailed description of the invention, taken in conjunction with the accompanying drawings of which.

Figure 1:
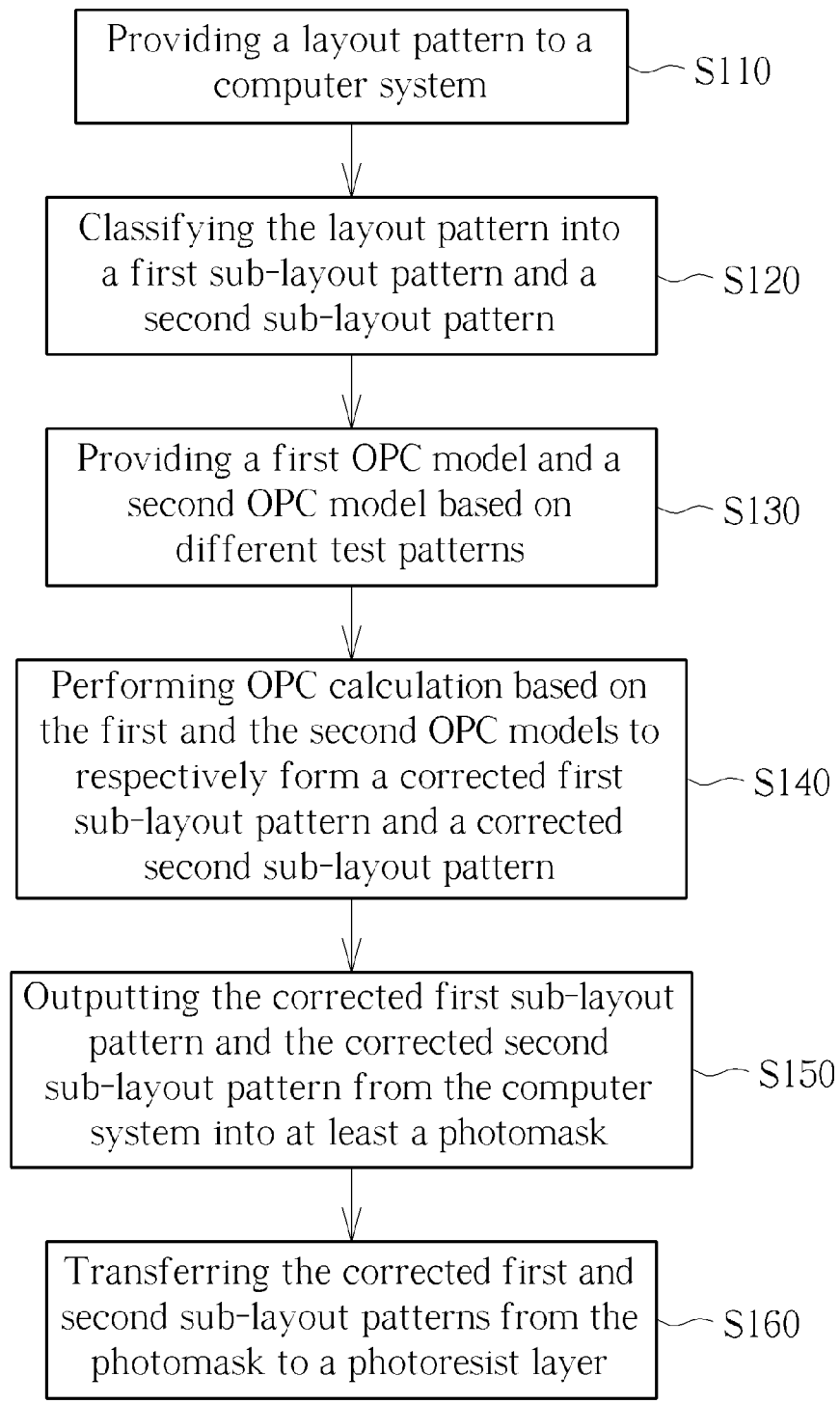
FIG. 1 is a simplified flow chart illustrating a method for performing an optical proximity correction (OPC) method according to a preferred exemplary embodiment of the present invention.

It will be appreciated that for simplicity and clarity of illustration, elements shown in the drawings have not necessarily been drawn to scale. For example, the dimensions of some of the elements may be exaggerated relatively to other elements for clarity.

DETAILED DESCRIPTION

In the following detailed description, numerous specific details are set forth in order to provide a thorough understanding of the various embodiments of the invention. However, it will be understood by those of ordinary skill in the art that embodiments of the invention may be practiced without these specific details. In other instances, well-known methods and procedures may have not been described in detail in order not to obscure description of the various embodiments of the invention.

In the following description, various figures, diagrams, flowcharts, models, and descriptions are presented as different means to effectively convey the substances and illustrate different embodiments of the invention that are proposed in this application. It shall be understood by those skilled in the art that they are provided merely as exemplary samples, and shall not be constructed as limitation to the invention.

First, please refer to FIG. 1. FIG. 1 is a simplified flow chart illustrating a method for performing an optical proximity correction (OPC) method according to a preferred exemplary embodiment of the present invention. As shown in FIG. 1, in step S110, a layout pattern with an ideal contour is first provided to a database of a computer system, which includes a plurality of geometric patterns. In step S120, the layout pattern is classified into at least a first sub-layout pattern and a second sub-layout pattern. Preferably, the first sub-layout pattern includes a plurality of geometric patterns having an length-to-width ratio between 1 and 5, and the second sub-layout pattern includes a plurality of geometric patterns having an length-to-width ratio higher than 5. In step S130, a first OPC model and a second OPC model are provided individually based on different test patterns. Subsequently, in step S140, an OPC calculation based on the first OPC model is performed on the first sub-layout pattern so as to form a corrected first sub-layout pattern, and an OPC calculation based on the second OPC model is performed on the second sub-layout pattern so as to form a corrected second sub-layout pattern. Afterwards, in step S150, the corrected first sub-layout pattern and the corrected second sub-layout pattern may be output from the computer system into at least a photomask. Finally, in step S160, the corrected first and second sub-layout patterns are transferred from the photomask to a photoresist layer so as to form geometric patterns with various length-to-width ratios in the photoresist layer. According to the processes illustrated in FIG. 1, since the corrected first sub-layout pattern and the corrected second sub-layout pattern are respectively provided through two OPC calculations based on different OPC models, i.e. the first and the second OPC models, the geometric patterns formed in the photoresist layer with relatively high length-to-width ratio (i.e. higher than 5) may not collapse and may have its contour almost identical to that of the original designed layout pattern when transferred into the photoresist layer.

The simplified flow chart and the main characteristic of the present invention are roughly disclosed in the previous paragraph. In order to enable the person skilled in the art to understand and carry out the present invention, the detailed description of which is further described in the following paragraph.

Figure 2:
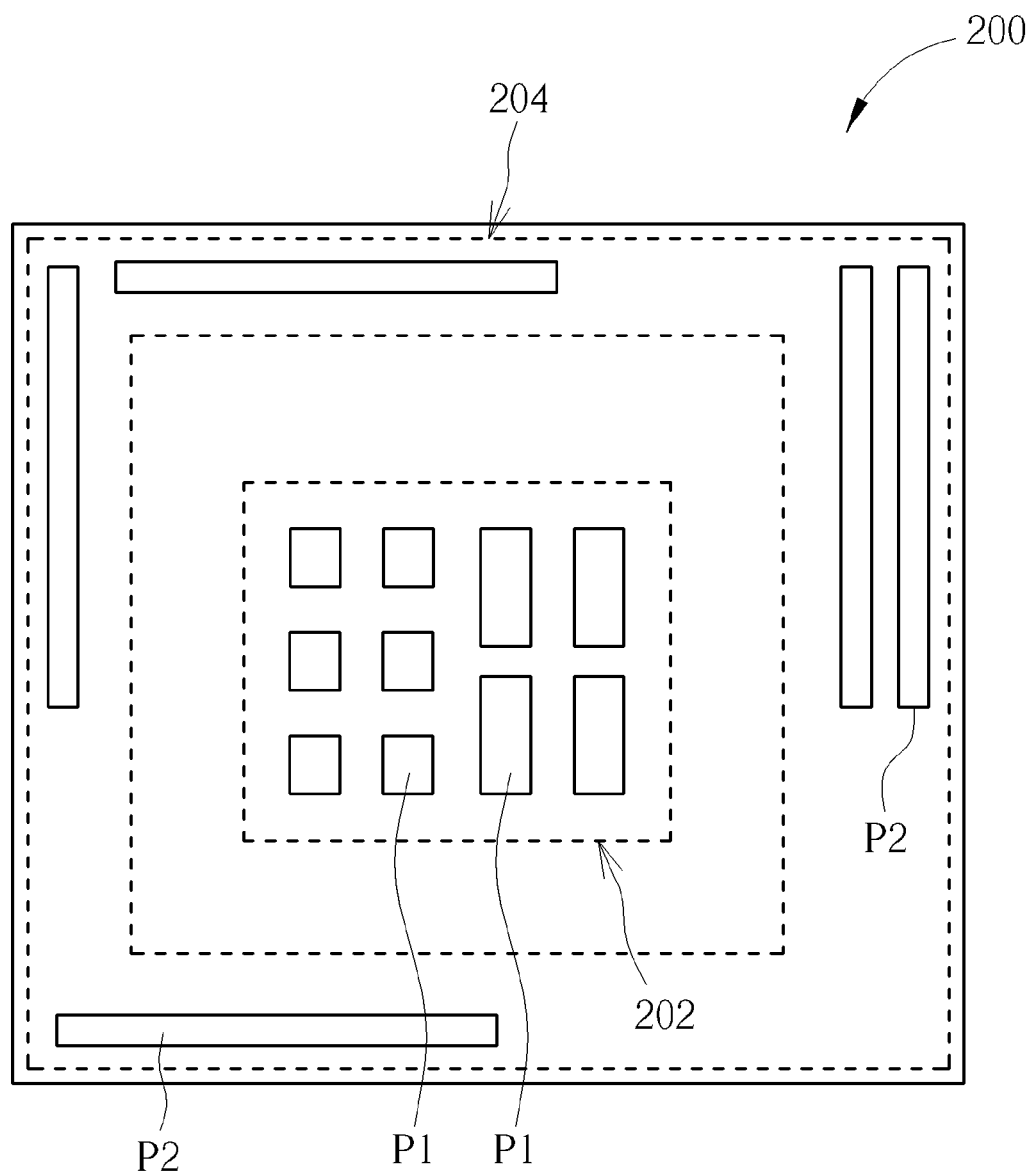
FIG. 2 is schematic diagram illustrating a method of for performing an optical proximity correction (OPC) method according to a preferred exemplary embodiment of the present invention.

Please refer to FIG. 1 and FIG. 2. FIG. 2 is a schematic diagram illustrating a method for performing an optical proximity correction (OPC) according to one preferred embodiment of the present invention. As shown in FIG. 1 and FIG. 2, in step S110, a layout pattern 200 is first provided to a database of a computer system. The layout pattern 200, which is an ideal designed pattern supposed to be later transferred on a mask or a photoresist layer on a wafer, may include feature patterns used to construct integrated circuit (IC) such as doped region patterns, device patterns, or layout of circuits, but not limited thereto. In step S120, the layout pattern 200 is classified into at least a first sub-layout pattern P1 and a second sub-layout pattern P2. The first sub-layout pattern P1 and the second sub-layout pattern P2 are respectively within a first region 202 and a second region 204. According to one embodiment of the present invention, since both the first sub-layout pattern P1 and the second sub-layout pattern P2 disclosed herein are preferably used to construct local interconnection (LIC), such as Metal 0 ($M_0$) layout pattern, or other interconnections, such as metal 1 ($M_1$), metal 2 ($M_2$) and so forth, the first sub-layout pattern P1 may include several geometric patterns having an length-to-width ratio between 1 and 5, while the second sub-layout pattern P2 may include several geometric patterns having an length-to-width ratio higher than 5. Preferably, the first region 202 may be a logic circuit region and the second region 204 may be a non-logic circuit region, but it is not limited thereto.

Figure 3:
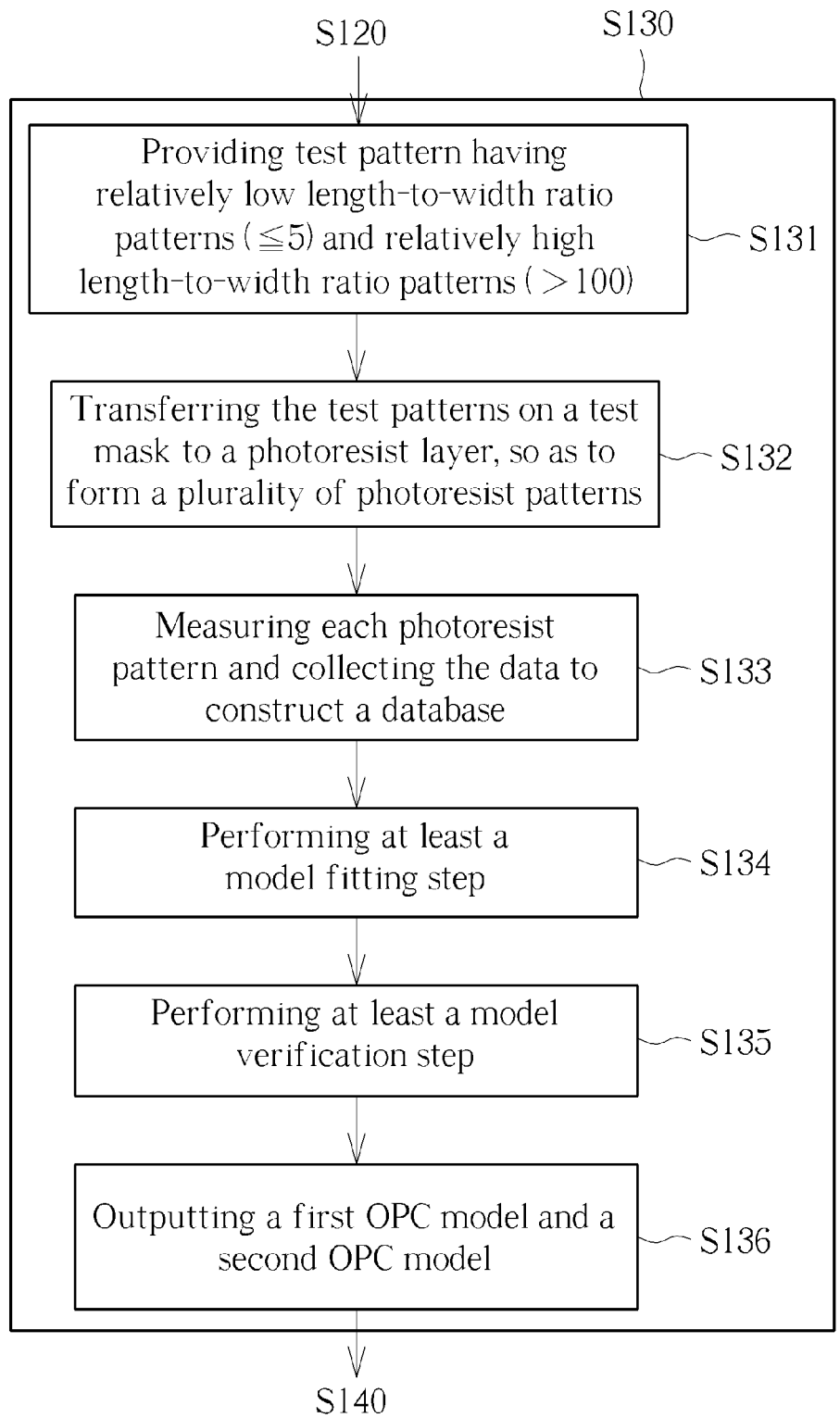
FIG. 3 is a simplified flow chart illustrating steps for providing the first and the second OPC models.
Figure 4:
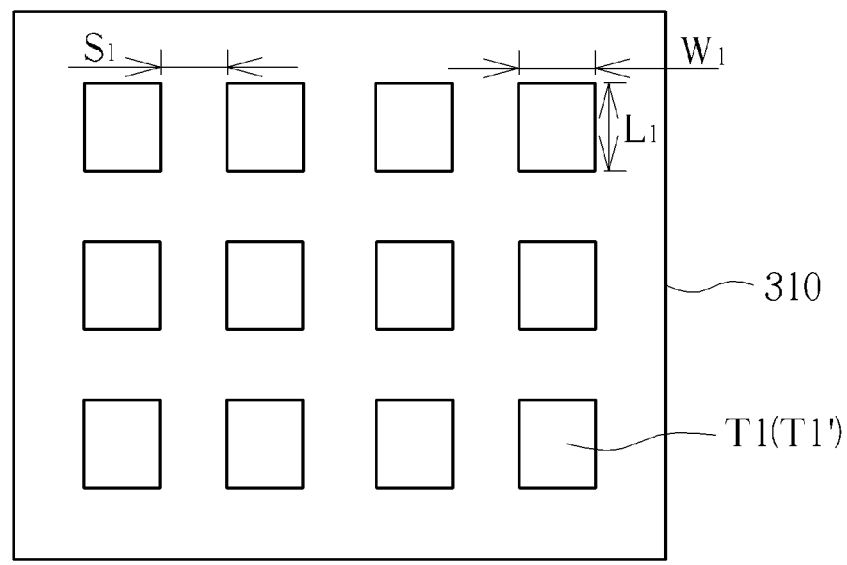
FIG. 4 and FIG. 5 are schematic diagrams respectively showing a test mask having a test pattern.
Figure 5:
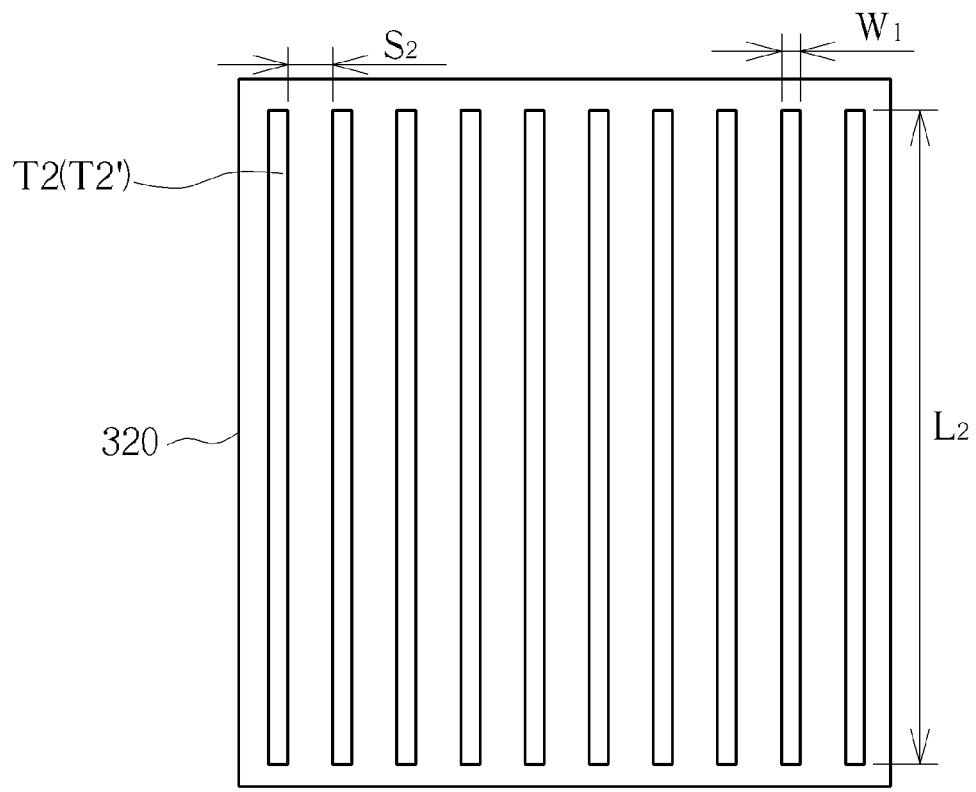

Still keep referring to FIG. 1; when step S120 is accomplished, step S130 for providing a first OPC model and a second OPC model is performed subsequently. In order to provide a first OPC model and a second OPC model that are suitable for OPC applications, the first step includes putting or laying features of known dimensions on a test mask. That is to say, a test pattern on the test mask is first provided, which includes data of the geometric pattern, such as various critical dimensions (CDs), various pattern densities, various line widths, and various pitches, but not limited thereto. Please refer to FIG. 3, FIG. 4 and FIG. 5. FIG. 3 is a simplified flow chart illustrating steps for providing the first and the second OPC models. FIG. 4 and FIG. 5 are schematic diagrams respectively showing a test mask having a test pattern. As shown in step S131, at least a test mask having a test pattern with relatively low length-to-width ratio patterns (≤5) and relatively high length-to-width ratio patterns (>100) is provided. As shown in FIG. 4 and FIG. 5, a first test pattern T1 and a second test pattern T2 may be respectively written on two individually separated test masks through electronic beam writing processes or laser beam writing process according to one embodiment of the present invention, but not limited thereto. According to the structure shown in FIG. 4, a first test mask 310 having a first test pattern T1 is provided. In this case, the first test pattern T1 has a plurality of sub-test patterns T1' arranged in a matrix layout. Each of the sub-test patterns T1' may have a width W1 and a length L1, and is spaced apart from the adjacent sub-test patterns T1' by a space S1. Preferably, the length-to-width ratio (i.e. the ratio of length to width) of each sub-test pattern T1' is between 1 and 5. For example, the length-to-width ratio of each of the sub-test patterns T1' may consist of 1.5, 2, 3 and 5, but not limited to this. Furthermore, according to the structure shown in FIG. 5, a second test mask 320 having a second test pattern T2 is provided. In this case, the second test pattern T2 has a plurality of parallel sub-test patterns T2' spaced apart from each other by a space S2. Each of the sub-test patterns T2' may have a width W2 and a length L2. Preferably, the length-to-width ratio of each sub-test pattern T2' is higher than 100. It should be noted that the space S1 shown in FIG. 4 is preferably shorter than the space S2 shown in FIG. 5 according to this embodiment. Additionally, even though the first test pattern T1 and the second test pattern T2 are respectively formed in individual test masks, they may also be formed in the same test mask according to other embodiments of the present invention.

Then, in step S132, the test patterns T1 and T2 on the test masks 310 and 320 may be transferred to a photoresist layer so as to form a plurality of photoresist patterns. The method of transferring the pattern on the mask to the photoresist layer comprises, for example, performing an exposure step and a development step in sequence, which are well-known to those skilled in the art, and thus will not described herein. Since the contour of these photoresist patterns may deviate from what was intended to be formed on the photoresist layer, each photoresist pattern needs to be measured and be further converted to a digitized data file as shown in step S133 so as to construct required OPC models. To put it more concretely, the step for measuring the photoresist patterns and collecting the data comprises, for example, measuring the CD of each photoresist pattern by using a SEM. Usually, when the pattern on the photomask is transferred to the photoresist layer through the exposure and the development steps, the formed photoresist patterns may have deviation problems, such as corner rounding or changes in line width, due to interferences with the light source used in the exposure step and the influence of the photoresist material in the photoresist layer, that is, the optical proximity effect (OPE). Therefore, the formed photoresist patterns may not be identical to the pattern on the test mask. The method of constructing the database comprises, for example, calculating the deviation value between the measured result of each photoresist pattern and the corresponding modified pattern, collecting the deviation values between the photoresist patterns and the modified patterns of various different designed patterns, and then storing all relative data to construct a database.

Through steps S134 and S135, a model fitting step and a model verification step are carried out repeatedly to construct a first and a second OPC model according to the data of the database and the digitalized modified pattern. The purpose of the model fitting step and the model verification step is to check aspects of the OPC model, such as the ability of the OPC model to accurately predict the CDs of the printed features, and to predict failure aspects, such as bridging, pinching, necking, and ringing, under different process conditions. To put it more concretely, the construction of the OPC models is carried out by using the existing software package, into which the data of the database are input, calculated and then modified to generate the model. In an embodiment, the step of constructing the OPC models further includes inputting a physical parameter and a statistical parameter into the software package. The physical parameter includes a numerical aperture (NA), a sigma, an illuminator shape, or film stack properties. The statistical parameter includes a pattern density or an aerial image slope.

Please refer back to FIG. 1. After step S130 is accomplished, step S140 for performing the OPC calculation is carried out subsequently. In step S140, at lest two kinds of OPC calculation (i.e. an OPC calculation based on a first OPC model and an OPC calculation based on a second OPC model) are carried out in order to correct the layout pattern stored in the computer system. For the sake of clarity, detailed steps in the OPC calculation based on the first OPC model is described in the following paragraph. It should be noted that, since steps performed in the OPC calculation based on the first OPC model may be similarly performed in the OPC calculation based on the second OPC model, the detailed description of steps performed in the OPC calculation based on the second OPC model is therefore omitted. The OPC calculation based on the first OPC model may include the following steps. For example, the line width, the pattern density and the relative position of each of the geometric patterns of the first sub-layout pattern is first collected and further compared with the correction standard in the data base. Subsequently, the correction value, i.e. the adjustment of each of the geometric patterns, can be calculated to correct the line width, the line end or the corner of the line segment of each of the geometric patterns. The usual way of correcting the patterns includes an adjustment of the line width of the line segment, and the disposition of assist patterns, such as serif or hammerhead patterns at the line end or the corner, which may avoid the deviation of the transferred patterns, such as rounded right-angle corners, shortened line-ends, or increasing/decreasing of the line widths when the mask patterns are later transferred onto the target layer, such as the photoresist layer on the wafer. It should be noted that, the main characteristic of the present invention is that an OPC calculation based on the first OPC model is performed on the first sub-layout pattern so as to form a corrected first sub-layout pattern, and an OPC calculation based on the second OPC model is performed on the second sub-layout pattern so as to form a corrected second sub-layout pattern.

Furthermore, an inspection step may be further performed in step S140 to check if a corrected sub-layout patterns obey the rules of the process rule check (PRC) and the lithography rule check (LRC) in order to confirm the correctness of the corrected layout pattern and the contour of the layout pattern. If the inspection requirements are fulfilled, the corrected layout pattern can be output in step S150; otherwise, the corrected layout pattern may be provided to the computer system again, followed by the illustrated classification step and several iterations of OPC calculations, to be overall or partially modified.

Subsequently, in step S150, the corrected first sub-layout pattern and the corrected second sub-layout pattern may be output from the computer system into at least a photomask. For example, the corrected first sub-layout pattern and the corrected second sub-layout pattern are preferably written on the same photomask. However, they may also be written on two individual photomasks according the requirements of the photolithography processes. Finally, in step S160, the corrected first and second sub-layout patterns are transferred from the photomask to a photoresist layer through one or more photolithography process. In this way, geometric patterns with various length-to-width ratios may be formed in the photoresist layer. It is worth noting that, according to one embodiment of the present invention, the corrected first sub-layout pattern and the corrected second sub-layout pattern are preferably written on the same photomask so that they can be transferred to the a photoresist layer through only one photolithography process, but not limited to this. In addition, according to another embodiment of the present invention, the corrected first sub-layout pattern may be output from the computer system to a first photomask and the corrected second sub-layout pattern may be output from the computer system to a second photomask. In this way, the corrected first sub-layout pattern on the first photomask may be first transferred to a photoresist layer through one photolithography process followed by transferring the corrected second sub-layout pattern on the second photomask to the same photoresist layer through another photolithography process (which may be regarded as a double patterning process), and vice versa.

To summarize, the main characteristic of the present invention is a layout pattern that may be first classified into a first sub-layout pattern and a second sub-layout pattern. Preferably, the first sub-layout pattern has a plurality of geometric patterns with length-to-width ratios between 1 and 5 and the second sub-layout pattern has a plurality of geometric patterns with length-to-width ratios higher than 5. Since two OPC calculations with different OPC models, i.e. the first and the second OPC models, are respectively performed on the first sub-layout pattern and the second sub-layout pattern in order to form the corrected first sub-layout pattern and the corrected second sub-layout pattern, the geometric patterns with relatively high length-to-width ratios may not collapse and may have their contour almost identical to that of the original layout pattern when transferred into a photoresist layer through photolithography processes.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of optical proximity correction (OPC), comprising:
    providing a layout pattern comprising a plurality of geometric patterns to a computer system;
    classifying the layout pattern into a first sub-layout pattern and a second sub-layout pattern, wherein length-to-width ratios of all the geometric patterns in the first sub-layout are less than length-to-width ratios of all the geometric patterns in the second sub-layout pattern;
    performing an OPC calculation based on a first OPC model on the first sub-layout pattern so as to form a corrected first sub-layout pattern;
    performing an OPC calculation based on a second OPC model on the second sub-layout pattern so as to form a corrected second sub-layout pattern; and
    outputting the corrected first sub-layout pattern and the corrected second sub-layout pattern from the computer system into a photomask.

2. The method according to claim 1, wherein each of the geometric patterns in the first sub-layout pattern has a length-to-width ratio between 1 and 5.

3. The method according to claim 1, wherein each of the geometric patterns in the second sub-layout pattern has a length-to-width ratio higher than 5.

4. The method according to claim 1, wherein the first OPC model is provided from data based on a test pattern, and the test pattern has a plurality of sub-test patterns having length-to-width ratios between 1 and 5.

5. The method according to claim 1, wherein the second OPC model is provided from data based on a test pattern, and the test pattern has a plurality of sub-test patterns having length-to-width ratios higher than 5.

6. The method according to claim 1, wherein the second OPC model is provided from data based on a test pattern, and the test pattern has a plurality of sub-test patterns having length-to-width ratios higher than 100.

7. The method according to claim 1, before performing the OPC calculation, further comprising:
    performing at least a model fitting step; and
    performing at least a model verification step.

8. The method according to claim 1, wherein the optical proximity correction is a model-based optical proximity correction.

* * * * *